United States Patent [19]
Takahashi et al.

[11] Patent Number: 5,559,434
[45] Date of Patent: Sep. 24, 1996

[54] MAGNETIC RESONANCE IMAGING APPARATUS AND RF COIL EMPLOYED THEREIN

[75] Inventors: Tetsuhiko Takahashi, Souka; Etsuji Yamamoto, Akishima; Yoshiki Murakami, Nerima-ku; Yoshikuni Matsunaga, Hachiouji, all of Japan

[73] Assignee: Hitachi, Ltd., Tokyo, Japan

[21] Appl. No.: 516,892

[22] Filed: Aug. 18, 1995

Related U.S. Application Data

[62] Division of Ser. No. 926,517, Aug. 10, 1992.

[30] Foreign Application Priority Data

Aug. 9, 1991 [JP] Japan ................................. 2-200253
Aug. 9, 1991 [JP] Japan ................................. 2-200254

[51] Int. Cl.$^6$ ................................................. G01V 3/00
[52] U.S. Cl. ............................................. 324/318; 324/322
[58] Field of Search ................................. 324/318, 322, 324/314, 319, 307, 309; 128/653.5

[56] References Cited

U.S. PATENT DOCUMENTS

| | | | |
|---|---|---|---|
| 4,680,548 | 7/1987 | Edelstein et al. | 324/318 |
| 4,694,255 | 9/1987 | Hayes | 324/318 |
| 4,782,298 | 11/1988 | Arakawa et al. | 324/318 |
| 4,820,987 | 4/1989 | Mens | 324/318 |
| 4,833,409 | 5/1989 | Eash | 324/318 |

*Primary Examiner*—Louis M. Arana
*Attorney, Agent, or Firm*—Antonelli, Terry, Stout & Kraus

[57] ABSTRACT

An MRI RF coil including first and second ring elements having a plurality of peripheral segments connected in ring shape which are apart from each other along a common vertical axial line. The RF coil also includes a plurality of axial conductive segments for connecting the first and second ring elements electrically to each other at the contacts of the plurality of peripheral segments with a plurality of current loops being formed by neighboring axial conductive segments and two peripheral segments connected thereby. Further, at least one control signal feeding point is positioned at any one of the peripheral segments of the first or second ring elements.

7 Claims, 14 Drawing Sheets

MAGNETIC RESONANCE IMAGING APPARATUS AND RF COIL EMPLOYED THEREIN

This application is a division of application Ser. No. 07/926,517, filed Aug. 10, 1992.

BACKGROUND OF THE INVENTION

The present invention relates to a magnetic resonance imaging (MRI) apparatus and a RF (radio frequency) coil employed therein. The RF coil of the present invention can be used for magnetic resonance spectroscopy (MRS) and magnetic resonance spectroscopy imaging (MRSI).

A saddle coil, a slotted tube resonator (hereinafter abbreviated to STR), and a bird cage resonator (hereinafter abbreviated to BCR) are conventionally used as a MRI RF coil.

As a method for improving the receiving sensitivity and transmitting efficiency of the above MRI RF coil, the QD (quadrature detection) method is widely used. This is a method for detecting a rotating high-frequency magnetic field with high sensitivity by generating two linear magnetic fields which cross at right angles and are shifted in phase at 90° so as to generate a combined rotating magnetic field or by detecting two linear magnetic field receiving signals crossing at angles and combining them by shifting their phases at 90°. Reception and transmission are electrically and electromagnetically reversible. Therefore, only reception will be described hereunder.

By the QD method, when the signal intensities from orthogonal coils are equal to each other, the sensitivity is increased ideally to 1.4 times of that by the individual linear magnetic field detection method.

In the case of an object to be inspected which has an elliptic section such as the human body, however, the load of the object to be inspected on a coil is different between the orthogonal coils and the detection sensitivity is greatly different between the orthogonal coils. In this case, there is a problem imposed that the increase in the receiving sensitivity by the QD method is limited.

A BCR with four-electrode symmetry is mentioned in Japanese Patent Application Laid-Open No. 61-95234 and Japanese Patent Application Laid-Open No. 60-132547. This coil has a BCR which comprises a pair of ring elements which are apart from each other along a common vertical axial line, a plurality of axial conductive segments for connecting these ring elements electrically to each other, and a plurality of capacitive elements which are arranged in these ring elements or axial conductive segments. An example of this coil is shown in the schematic representation in FIG. 9. Numeral 20 indicates a BCR and 24 a pickup coil. In the case of a high-pass BCR, two rings 21 and 22 are divided by 16 capacitors respectively so as to form ring elements. In this drawing, the capacitive elements are omitted. The rings are connected by 16 parallel conductors (called axial conductive segments or rungs) 23 in the vertical direction so as to form the BCR 20. In the drawing, only a part of the rung is shown. The power supply method is an inductive coupling method using, for example, the pickup coil 24. The ring diameter is, for example, 490 mm and the vertical length of the coil is 400 mm. The 2 rings and 16 conductors are copper pipes 4 mm in diameter. When each of the 32 capacitors is 48 pF in capacity, the resonance frequency for generating a uniform magnetic field in the coil is 61.22 MHz.

FIG. 10 shows an equivalent circuit of the high-pass BCR. In this drawing, the inductance of the conductor forming the coil is omitted. A1 and A2 shown in the drawing are connected to B1 and B2 respectively so as to form a circuit. Capacitors C1 and C17 and neighboring rungs thereof form a current loop which can be seen. There are 16 current loops in this example. Among them, only the 1st, 2nd, 3rd, 15th, and 16th current loops are shown in this drawing (the 4th to 14th current loops are omitted). The 16th current loop is connected to the 1st current loop. Power is supplied from terminals S1 and S2 of the pickup coil 24. The pickup coil 24 is coupled inductively to the BCR 20.

To use this BCR as a transmitting coil or a receiving coil, various decoupling arts are required. An example of the decoupling art is mentioned in Japanese Patent Application Laid-Open No. 63-175403. The conventional decoupling art is often applied to coils having a simple current path such as the surface coil or saddle coil, though it cannot be applied always to coils with a complicated shape and many current loops such as the BCR. An example of the BCR decoupling art is mentioned in Japanese Patent Application Laid-Open No. 63-171548. In this example, as shown in FIG. 11, diodes are inserted into a plurality of rungs in series and the rungs are turned on or off by dedicated control lines. There is a disadvantage in this example that to control the diodes in a batch, complicated dedicated lines are required and the coil shape is complicated. Furthermore, there is another problem that these wires disturb the uniformity of the magnetic field generated by the coil.

SUMMARY OF THE INVENTION

A first object of the present invention is to provide a magnetic resonance imaging apparatus which can detect signals with high sensitivity even when an object with an elliptical or flat section to be inspected is inserted into a probe and a RF probe for that purpose.

A second object of the present invention is to provide a plurality of RF coils which are suited to a MRI apparatus which is required to decouple the RF coils.

To accomplish the first object, according to the present invention, in a magnetic resonance imaging apparatus for irradiating a high-frequency magnetic field to an object to be inspected which is placed in a space defined by the x, y, and z coordinate axes wherein a static magnetic field exists in the z direction, for generating a magnetic resonance signal from the above object to be inspected, and for detecting a rotating high-frequency magnetic field on the xy plane by combining linear high-frequency magnetic field detection coils in the x and y directions, the magnetic field detection ranges of the linear high-frequency magnetic field detection coils in the above x and y directions, which are located along the z direction, are different from each other.

Before starting to describe the operation of the present invention, the receiving sensitivity by the QD method for an object with an elliptical section to be inspected will be examined first. The inventors examined the relationship between the transmitting and receiving point (the coil port position), the arrangement angle of an object with an elliptical section to be inspected (FIG. 2(a)), and the RF probe sensitivity when a 1.5 T BCR or STR is used. The result shows that, as shown in FIG. 2(b), as the arrangement angle increases, the relative sensitivity of the RF probe lowers and the sensitivity when the arrangement angle is 90° is about 60% of that when the arrangement angle is 0°. Since the probe impedance is adjusted to 50 ohm at every angle, the noise level is the same at every angle. Therefore, the signal to noise ratio (S/N) when the arrangement angle is 90° is reduced to 60% of that when the arrangement angle is 0°. To simplify description of numerical formulas, the value of signal to noise ratio is expressed by just SN hereinafter.

The maximum value of logical SN after QD probe signals when the arrangement angle of an object to be inspected is 0° and 90° are combined is expressed by the square sum of SN at each port (the value of SN when the arrangement angle is 0° is taken as SNA and that when the arrangement angle is 90° is taken as SNB) as shown below.

$$SN = SQRT(SNA^2 + SNB^2) \quad (1)$$
$$= SQRT(SNA^2 + (0.6 \times SNA)^2)$$
$$= 1.17 \times SNA$$

where SQRT indicates the square root of the value in the parentheses. To obtain the maximum SN value shown in Equation (1), it is necessary to multiply the SB value by the factor k obtained by the following equation and to combine the product with the SA value.

$$k = SA/SB \times (SNB/SNA)^2 \quad (2)$$

where SA and SB indicate the signal levels at the port A (the 0° position) and the port B (the 90° position).

As mentioned above, in imaging of the human body, the output is different between the orthogonal ports. Therefore, the expectable sensitivity increase of a QD probe wherein the signal addition weighting is optimized is at most 17% of that of a linear probe.

According to the present invention, this problem is solved as shown below. The probe sensitivity at the port B with a low output can be improved by reducing the view field in the sagittal direction or the z direction shown in FIG. 1. By reducing the view field, the effect of the load (the object to be inspected) is reduced and the sensitivity at the port B is increased. For example, the view field in the sagittal direction is made shorter than that at the port A by 20%.

In other words, by narrowing the high-frequency magnetic field generation range of a coil of the orthogonal coils, which has a low detection sensitivity because the body load on the coil is high, in the static magnetic field compared with the high-frequency magnetic field generation range of another coil, the effect of the load of the former coil is reduced and the S/N increases. Therefore, the sensitivity difference between the coils reduces relatively and the sensitivity increase rate by the QD method is improved.

To accomplish the second object, according to the present invention, in a MRI RF coil comprising a pair of ring elements which are apart from each other along a common vertical axial line and contain a plurality of series-connected capacitive elements which are apart from each other along the peripheries thereof, a plurality of axial conductive segments for connecting the above ring elements electrically to each other at a point between the neighboring series-connected capacitive elements, and at least one feeding point, at least a plurality of the above capacitive elements have diodes in series with the above elements and inductive elements in parallel with the above elements and the above diode group is kept under ON and OFF control by a voltage externally applied to the above RF coil.

Although the RF coil is divided by many capacitive elements, a voltage signal externally supplied to the above RF coil is simultaneously supplied to the above many capacitive elements via the inductive elements arranged in parallel with the above capacitive elements. Therefore, without dedicated lines being used for controlling the above diodes, the ON and OFF control for the above plurality of diodes can be optionally performed simultaneously.

DETAILED DESCRIPTION OF THE PREFERRED EMBODIMENTS

Figure 1:
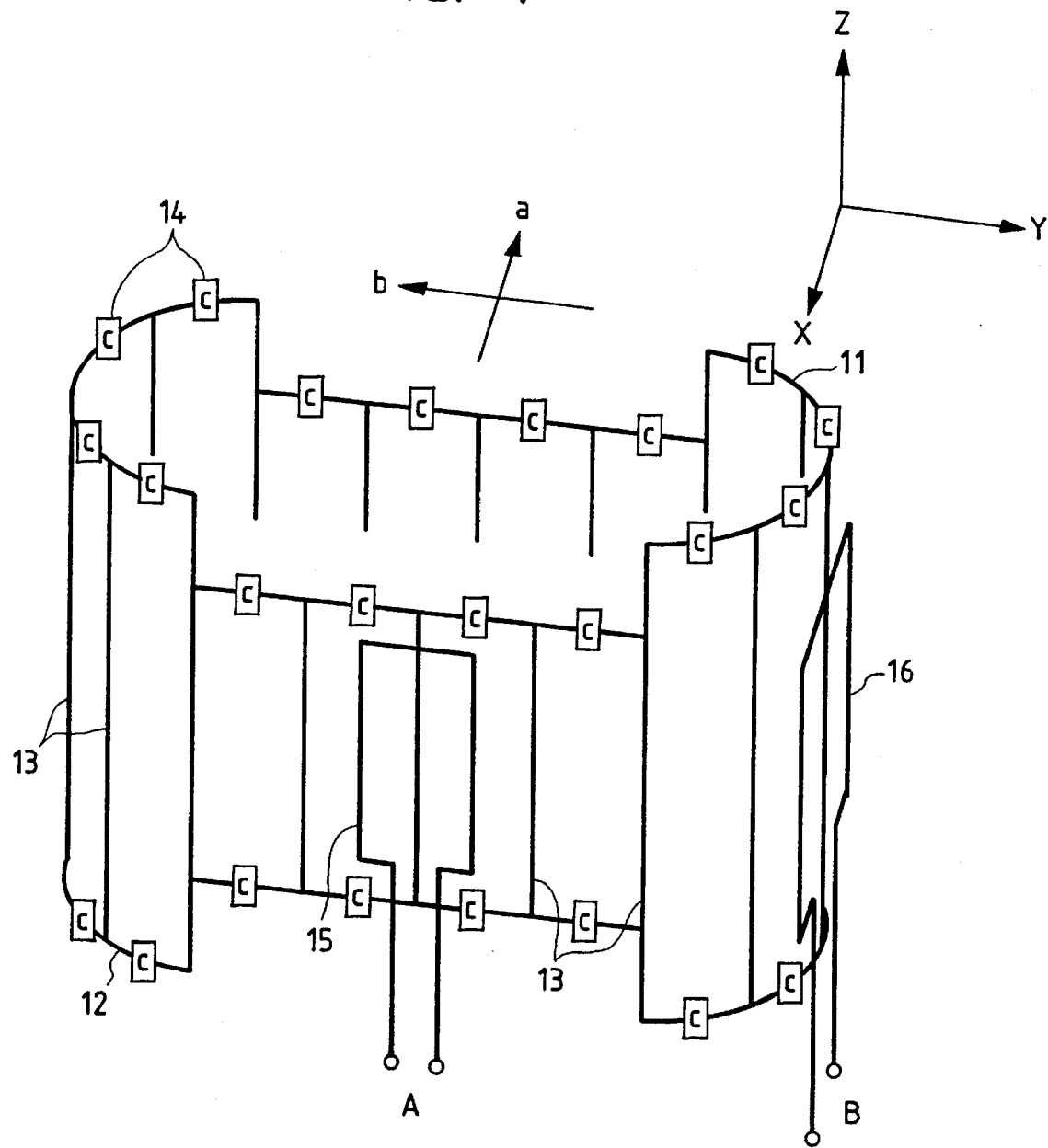
FIG. 1 is a perspective view showing a RF probe of an embodiment of the present invention.

The present invention will be explained using the embodiment shown in FIG. 1. FIG. 1 is a perspective view of the RF probe of the embodiment. This probe is a probe wherein the thought of the present invention is applied to the bird cage probe mentioned in Japanese Patent Application Laid-Open No. 61-95234 and Japanese Patent Application Laid-Open No. 60-132547. The bird cage resonator (BCR) comprises a pair of conductive loop (or ring) elements 11 and 12 which are apart from each other along a common vertical axial line (the z-axial direction), a plurality of axial conductive segments (or rungs) 13 for connecting the above conductive loop elements electrically to each other, and a plurality of capacitive elements which are arranged in the above loops or segments. The example in the drawing shows a high-pass BCR wherein the capacitive elements 14 are arranged in the loops. A pickup coil 15 with an axis parallel to the x direction and a pickup coil 16 with an axis parallel to the y direction are inductively coupled to the BCR. A high-frequency signal supplied from a feeding point (a transmitting and a receiving port) A connected to the pickup coil 15 generates a magnetic field in the direction of the arrow a (the x direction) shown in the drawing. Furthermore, a high-frequency signal supplied from a feeding point (a transmitting and a receiving port) B generates a magnetic field in the direction of the arrow b (the y direction) shown in the drawing or in the direction perpendicular to the arrow a. When a high frequency magnetic field is received, a detection output of the high-frequency magnetic field in the x direction is obtained from the port A and a detection output of the high-frequency magnetic field in the y direction is obtained from the port B. The characteristic of the probe structure of this embodiment is that the length of the first segment group of the plurality of axial conductive segments 13 which acts mainly for generating and detecting the high-frequency magnetic field in the x direction is different from the length of the second segment group which acts mainly for generating and detecting the high-frequency magnetic field in the y direction. Assuming a plane which passes the vertical axial line of the probe and is parallel to the yz plane as a first plane and a plane which passes the vertical axial line of the probe and is parallel to the xz plane as a second plane, the first segment group is arranged closer to the first plane than to the second plane, so that the segments thereof are practically opposite to each other on both sides of the second plane. The second segment group is arranged closer to the second plane reversely than to the first plane, so that the segments thereof are practically opposite to each other on both sides of the first plane.

In a probe of this structure, the length of the detection range in the z direction of a linear high-frequency magnetic field in the y direction is different from the length of the detection range in the z direction of a linear high-frequency magnetic field in the x direction. In other words, a magnetic resonance imaging apparatus for using this probe so as to receive magnetic resonance signals is a magnetic resonance imaging apparatus for irradiating a high-frequency magnetic field to an object to be inspected which is placed in an x, y, and z coordinate space wherein a static magnetic field exists in the z direction, for generating a magnetic resonance in the object to be inspected, and for detecting a rotating high-frequency magnetic field on the xy plane caused by the magnetic resonance in the object to be inspected by means of a combination of linear high-frequency magnetic field detection coils in the x and y directions, wherein the magnetic field detection ranges of the linear high-frequency magnetic field detection coils in the above x and y directions are different from each other in the Z direction. Furthermore, a magnetic resonance imaging apparatus for using this probe so as to transmit a high-frequency magnetic field to an object to be inspected is a magnetic resonance imaging apparatus for irradiating a rotating high-frequency magnetic field on the xy plane which is created by combining linear high-frequency magnetic fields in the x and y directions to an object to be inspected which is placed in an x, y, and z coordinate space wherein a static magnetic field exists in the z direction and for generating and detecting a magnetic resonance signal from the above object to be inspected, wherein the magnetic field generation ranges of the linear high-frequency magnetic fields in the above x and y directions are different from each other in the Z direction. This probe may be used for both transmission and reception.

In this embodiment, the first segment group is equal to the second segment group in the number of segments. The angles of the ports A and B formed with the common vertical axial line are practically a right angle. The port A is at a location in the perpendicular direction to the above first plane from the vertical axial line and the port B is at a location in the perpendicular direction to the above second plane from the vertical axial line. The diameter of the coil is 550 mm and the length is 400 mm on the A port side and 500 mm on the B port side. The number of elements, that is, of current loops, each of which is a minimum unit formed by neighboring segments and a conductive loop element, is 16. There are 8 long elements and 8 short elements. The long elements are composed of copper pipes 5 mm in diameter and the short elements are composed of copper pipes 3 mm in diameter. The resonance frequency of the coil when the capacity of a capacitor inserted into each long element is set at 43 pF and the capacity of a capacitor inserted into each short element is set at 42 pF is 63.88 MHz as viewed from both ports. The pickup coil is composed of a copper pipe 3 mm in diameter. The impedance of the pickup coil at this time is adjusted to 50 ohm by a matching capacitor (not shown in the drawing) added to the pickup coil.

TABLE 1

| Shape | Output ratio between ports | Output after combination |
| --- | --- | --- |
| General QD BCR | 0.62 | 1.0 |
| QD BCR of the present invention | 0.74 | 1.07 |

A comparison of the output measured results when this probe is used for receiving MRI RF signals with those when a bird cage probe with the general shape is used is shown in Table 1. The output when the body of a grown-up man is inserted is measured. In the measurement, the direction of the plane (xz plane) whereon the short elements are placed coincides with the direction of the right and left shoulders. The long elements are arranged on a plane perpendicular to this plane. The table shows that the probe in this embodiment reduces the output difference between the orthogonal ports and increase the output after combination. The view field of the probe in this embodiment in the sagittal direction after combination is almost the same as that of the general BCR.

In the above embodiment, the number of long rungs is the same as that of short rungs. However, the number of one type of rungs may be larger than that of the other type of rungs when necessary. Furthermore, rungs with an intermediate length may be arranged between long and short rungs.

Figure 3A:
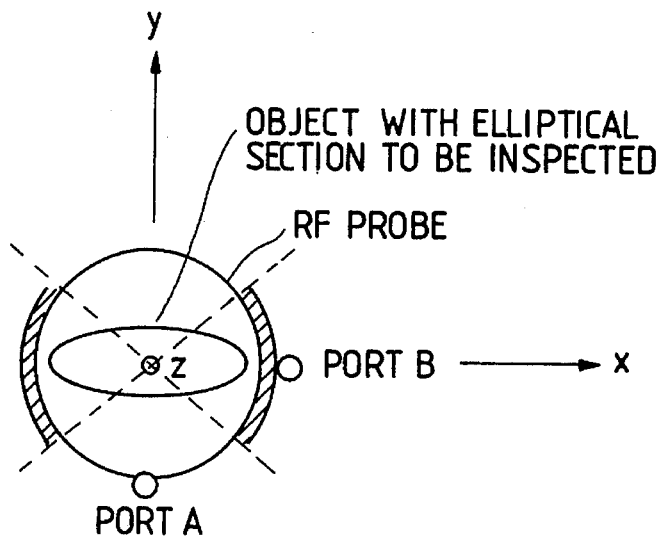
FIG. 3(a) is a sectional view showing the arrangement relationship between the RF probe shown in FIG. 1 and the object to be inspected.
Figure 3B:
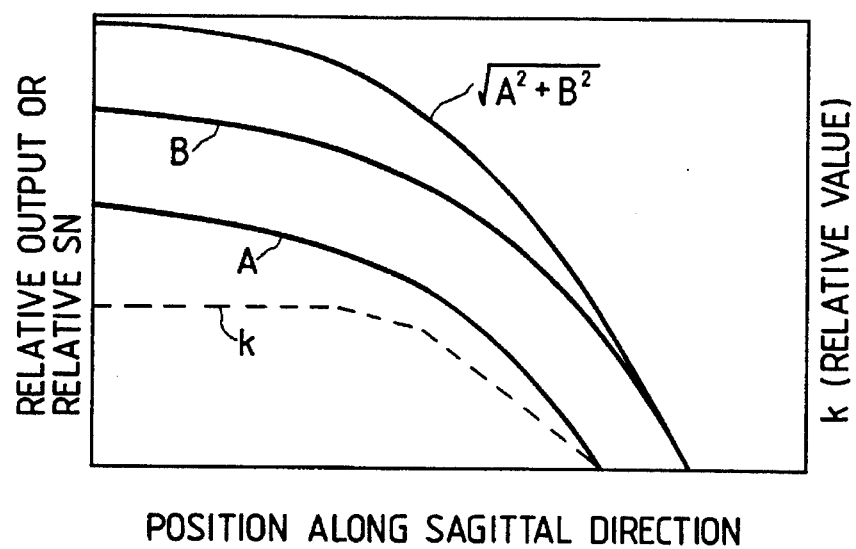
FIG. 3(b) is a graph showing characteristics of the embodiment shown in FIG. 1.

Next, a method for combining signals from the probe of the present invention will be explained with reference to FIGS. 3(a) and 3(b). FIG. 3(b) is a schematic view of output of each port at a position along the sagittal direction (z direction). The sensitivity at the port A is slightly lower than that at the port B and the view field at the port A in the sagittal direction is narrower than that at the port B. Therefore, the most suitable weighting factor k obtained by Equation (2) varies in the sagittal direction. The variation of k in the sagittal direction is shown by a dotted line in the drawing. In the MRI apparatus, the position z in the sagittal direction is linearly related to the magnetic resonance frequency kz corresponding to the gradient magnetic field in the z direction which is formed by a gradient magnetic field coil as shown below.

$$z \propto kz = Gamma \times HO \qquad (3)$$

where Gamma indicates a magnetic rotation ratio and HO indicates a magnetic field intensity in the z direction which is obtained as combination of the static magnetic field and the gradient magnetic field. Therefore, it is necessary to consider the most suitable weighting factor k shown in FIG. 3 as a function of the signal frequency f (=1/kz) when signals are combined.

Figure 4:
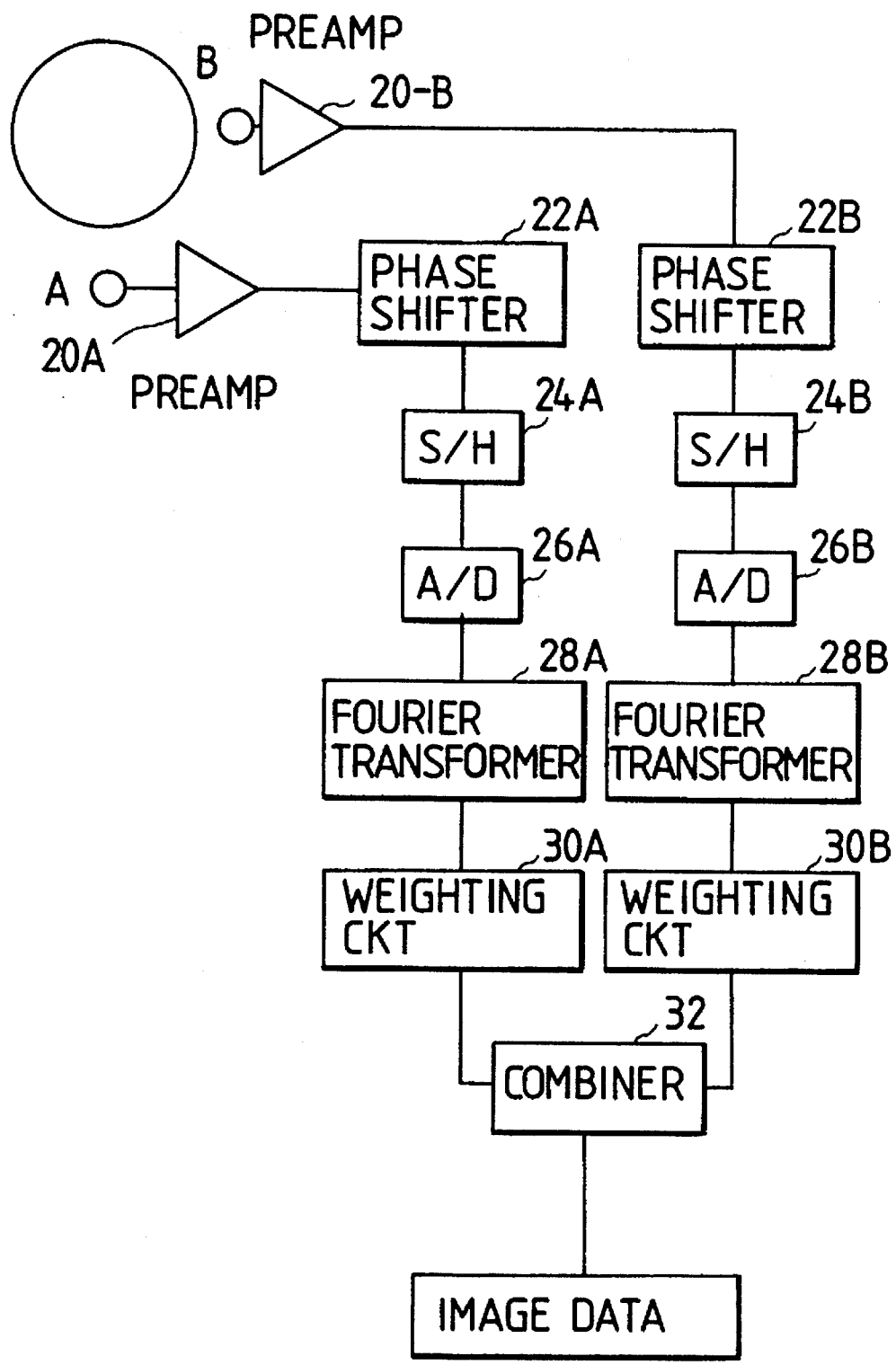
FIG. 4 is a block diagram showing an example of a signal detection system for using in the embodiment shown in FIG. 1.

FIG. 4 shows a shape of a signal detection system for realizing it. The outputs from the ports A and B of a QD probe are shifted from each other in phase by about 90°. These output signals are amplified by preamplifiers 20-A and 20-B respectively and finely adjusted by phase shifters 22-A and 22-B so that the phases thereof are shifted properly. The outputs are held by sample holders 24-A and 24-B respectively and converted to digital signals by A-D converters 26-A and 26-B. The digital signals are transformed by Fourier transformers 28-A and 28-B respectively, and weighted by weighting functions Ga (kz) and Gb (kz) in weighting circuits 30-A and 30-B respectively, and then added by a combiner 32 so as to output image data. The functions Ga (kz) and Gb (kz) can be written into the computer memory for each probe and for each port beforehand.

It is needless to say that the above description can be applied also to coronal or oblique imaging. When combining images on the x-y plane or transverse images, Ga (kz) and Gb (kz) can be handled as fixed values because k does not depend on the frequency in an image.

When combining multi-slice transverse images, although k does not depend on the frequency in a slice, the position in the z direction varies with each slice. Therefore, it is desirable to use Ga (kz) and Gb (kz) corresponding to the position in the z direction for each slice image data.

Figure 5:
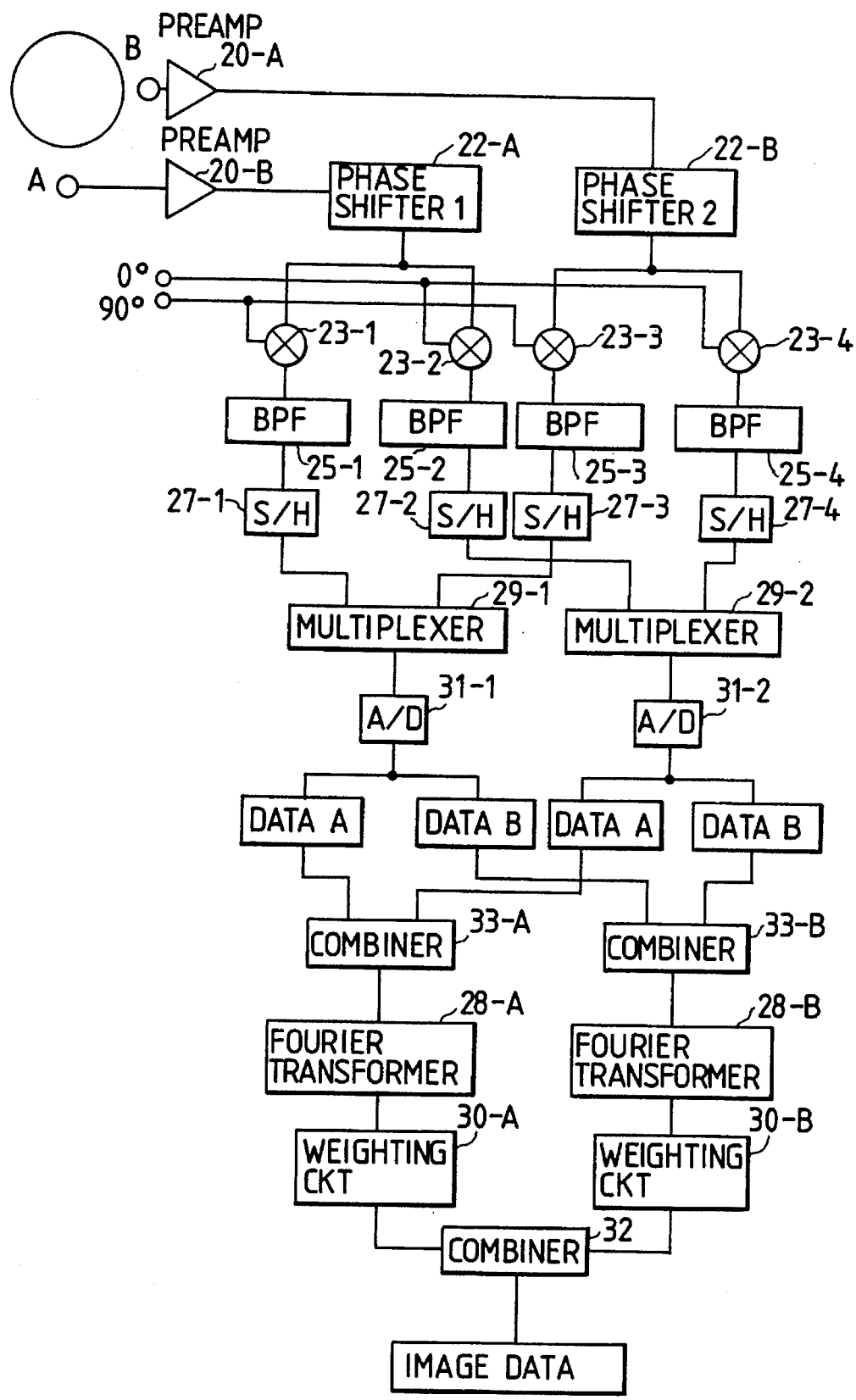
FIG. 5 is a block diagram showing another example of the signal detection system.

In FIG. 5, the same type of detection method as that of FIG. 4 is used, though each port output is subject to orthogonal phase detection. The A port output via the phase shifter 22-A is mixed with first and second reference signals with a phase difference of 90° by mixers 23-1 and 23-2 respectively and the low frequency components thereof are taken out by band-pass filters 25-1 and 25-2. In the same way, the B port output via the phase shifter 22-B is mixed with the above two reference signals by the mixers 23-1 and 23-2 respectively and the low frequency components thereof are taken out by the band-pass filters 25-1 and 25-2. Two detection outputs by the first reference signal which are held by sample holders 27-1 and 27-3 are sent alternately to an A-D converter 31-1 by a multiplexer 29-1 and two detection outputs by the second reference signal which are held by sample holders 27-2 and 27-4 are sent alternately to an A-D converter 31-2 by a multiplexer 29-2. Therefore, more precise detection is possible without increasing the number of A-D converters. The A-D conversion outputs are distributed to A port data and B port data respectively, combined respectively, subjected to the Fourier transformation and weighting processing, and then added.

Figure 6:
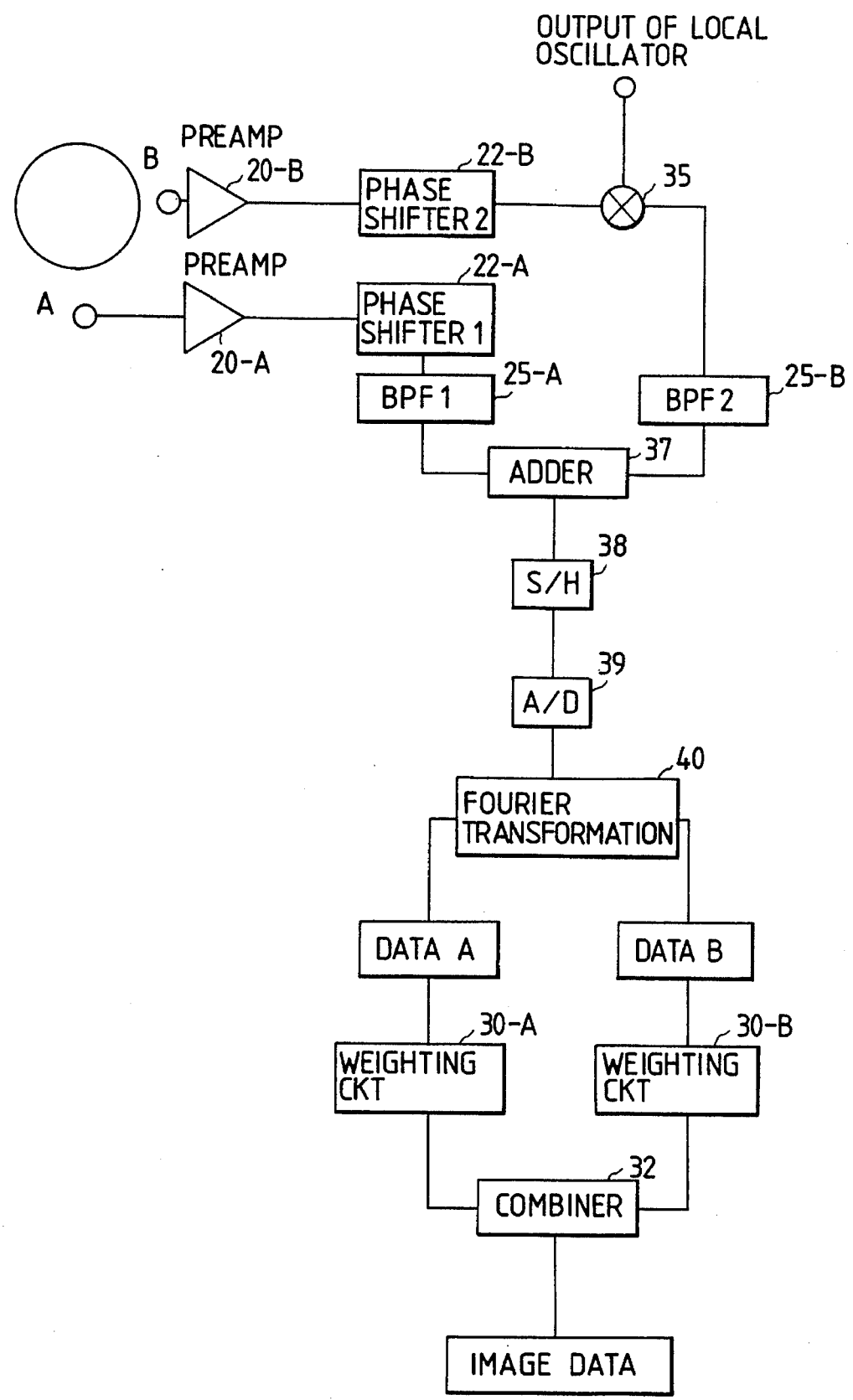
FIG. 6 is a block diagram showing a further example of the signal detection system.
Figure 7:
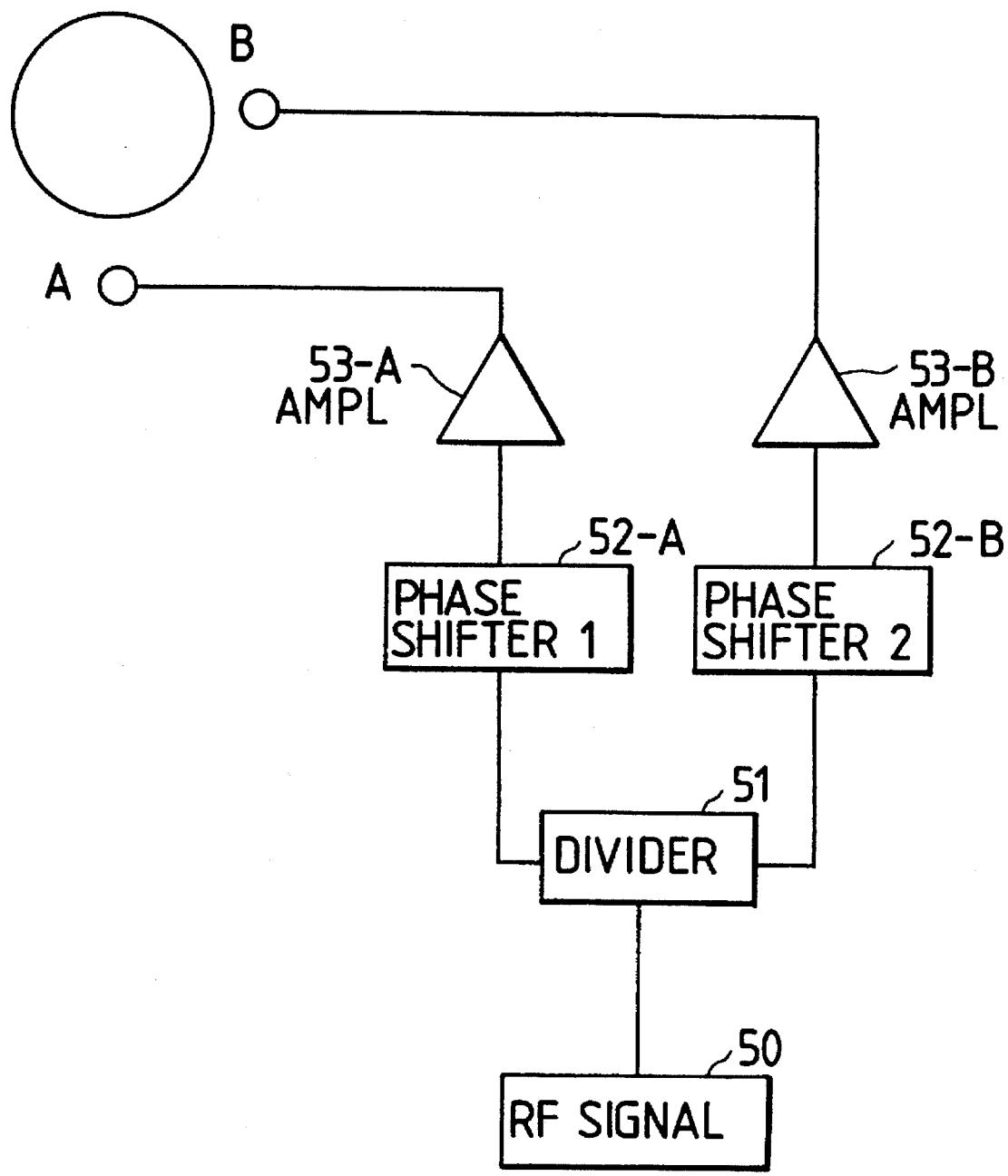
FIG. 7 is a block diagram showing an example of a transmission circuit for using in the embodiment shown in FIG. 1.

FIG. 6 shows a shape of another signal detection system. The outputs from the ports A and B of a QD probe are shifted from each other in phase by about 90°. These output signals are amplified by preamplifiers respectively and finely adjusted by phase shifters 1 and 2 so that the phases thereof are shifted properly. The frequency bands of the outputs from the ports A and B are determined from the view field of MRI images and the intensity of gradient magnetic field and they are the same. One output of these equal frequency band signals, that is, the output from the port B in this case is converted in frequency using a local oscillator, a mixer, and a band-pass filter 25-B. The output from the port A passes through a band-pass filter 25-A for the purpose of removing noise in other than the signal band and then is added to the output from the port B, whose frequency is converted, by an adder 37. The addition may be fixed weighting addition, for example, resistance addition. After addition, the signals are A-D converted by an A-D converter 38 and subjected to Fourier transformation. Data of the signals from the ports A and B after Fourier transformation appear in different frequency areas, so that they can be easily separated. The data which is separated at each port is weighted by the weighting functions thereof Ga (kz) and Gb (kz) and furthermore, the B data is moved to the frequency area which is the same as that of the A data by the phase shifter. Finally, the two data turn to added image data. According to this method, the signals from the two ports are added and then converted from analog to digital. Therefore, the detection system is simple and the scale thereof is small. Furthermore, it is easy to apply the orthogonal phase detection. The QD probe signal combining method indicated in this embodiment can be also used for general QD coil signal combination A general example of a RF transmission circuit when signals are transmitted by the probe of the present invention is shown in FIG. 7. A RF signal obtained from an oscillator 50 is divided into two parts by a divider 51 and the divided signals are adjusted by phase shifters 52-A and 52-B so that the phases thereof are shifted from each other by 90°. Thereafter, the signals are amplified by amplifiers 53-A and 53-b which are different in gain from each other respectively and supplied to the port A or B of the QD probe. It is desirable to control the gains of the amplifiers 1 and 2 independently in accordance with the load status. The wellknown art using a diode is used so as to switch transmission or reception of a RF signal at the port A or B.

The present invention can be applied not only to detection by the single method for using a coil for both transmission and reception but also to detection by the cross method for using different coils for transmission and reception. For example, by using the QD coil of the present invention for transmission and a well-known surface coil or phased array coil for reception, the spinal area can be imaged with high sensitivity.

Figure 8:
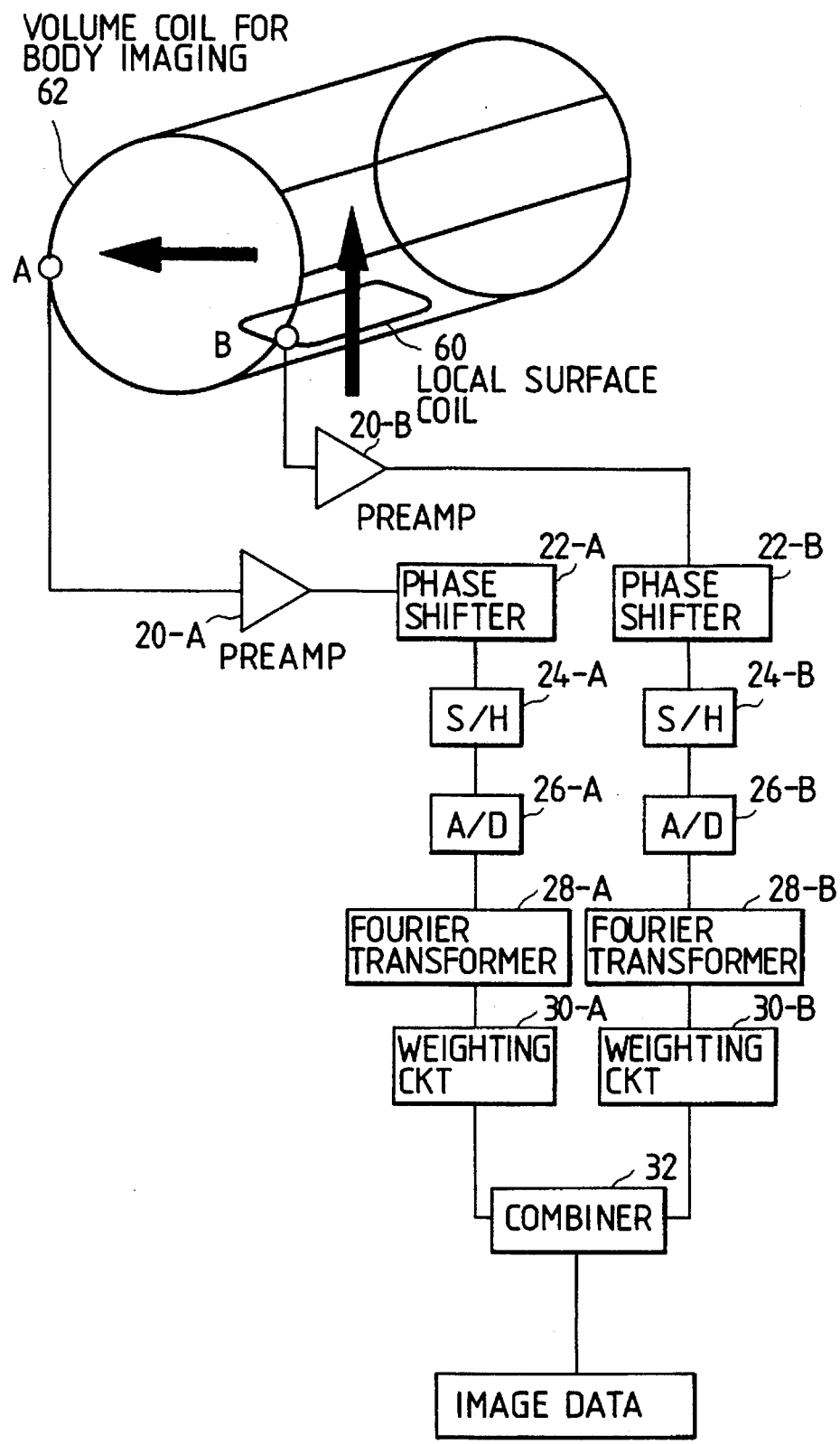
FIG. 8 is a schematic view showing a RF coil and a signal detection system thereof of another embodiment of the present invention.
Figure 9:
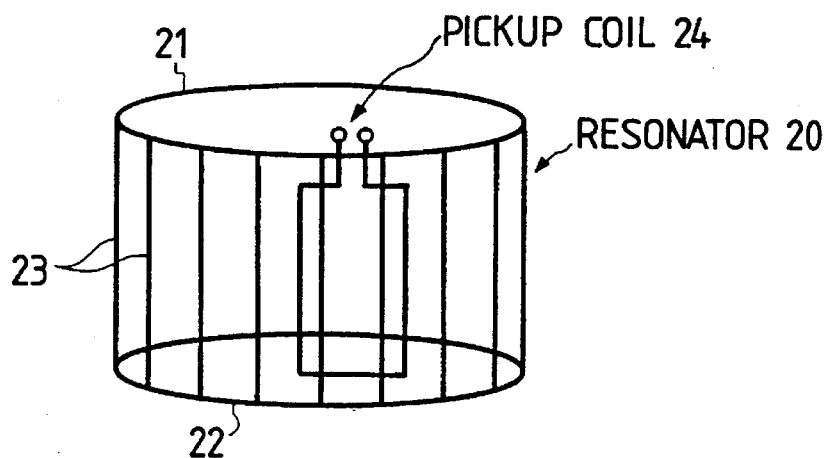
FIG. 9 is a schematic view showing the general structure of a BCR.

FIG. 8 is a conceptual diagram showing another coil structure for realizing the present invention. In this embodiment, a local surface coil 60 is used to generate a magnetic field in the vertical direction and a volume coil 62 for body imaging is used to generate a magnetic field in the horizontal direction. These outputs can be combined respectively by the aforementioned signal combining method and a QD probe with a wide view field and high sensitivity for the body can be realized. The QD probe of the present invention is suited, for example, to high-sensitivity imaging of the heart.

Next, another application of the resonator coil of the present invention shown in FIG. 1 will be explained. The characteristic of a probe of the structure shown in FIG. 1 is that since the view fields of the orthogonal two ports in the sagittal direction are different from each other as mentioned above, a probe wherein the sensitivities thereof are different from each other can be realized. This characteristic can be applied to a double tuning coil which is used for magnetic resonance spectroscopy (MRS). A port with a wide view field can be used for hydrogen imaging at a high signal level and a port with a narrow view field but a high sensitivity can be used for other various purposes, for example, phosphorus or carbon MRS. When setting orthogonal two ports to different resonance frequencies, the well-known probe designing art can be applied. By using the probe of this embodiment, MRSI (magnetic resonance spectroscopy imaging) with a wide view field and high sensitivity can be realized.

In a magnetic resonance imaging apparatus having a QD probe, the remarkable detection sensitivity difference between the orthogonal coils for an object with an elliptical section to be inspected such as the human body is eliminated and the receiving sensitivity by the QD method is improved.

Figure 2A:
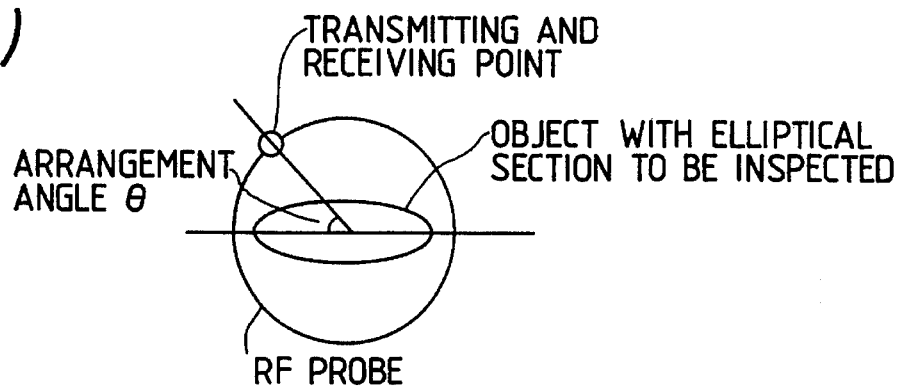
FIG. 2(a) is a drawing showing the arrangement angle at the transmitting and receiving point of a RF probe for an object to be inspected.
Figure 2B:
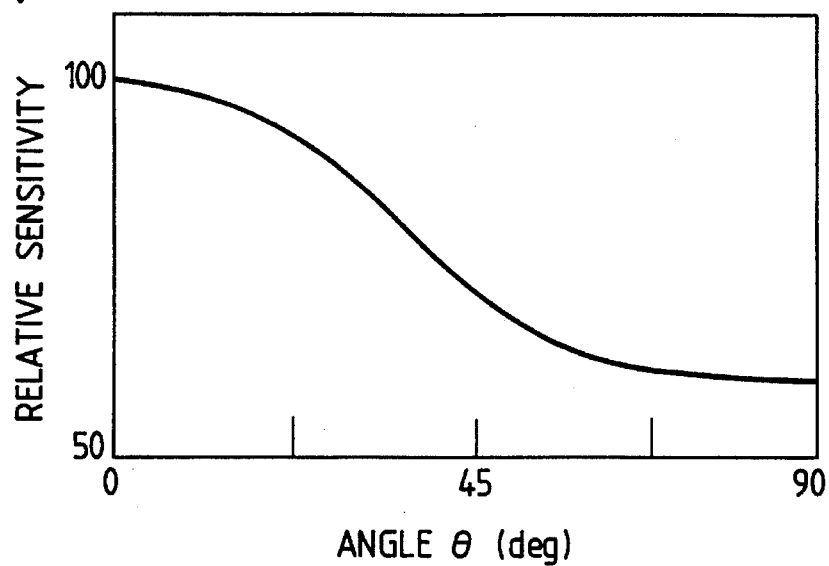
FIG. 2(b) is a graph showing the relative sensitivity of the RF probe at the arrangement angle.
Figure 10:
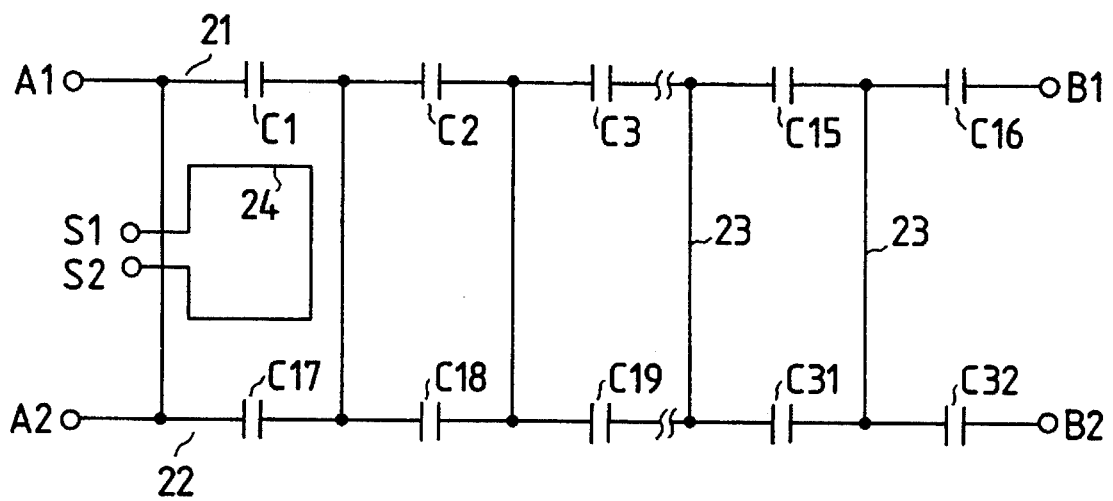
FIG. 10 is an equivalent circuit diagram of a BCR.
Figure 11:
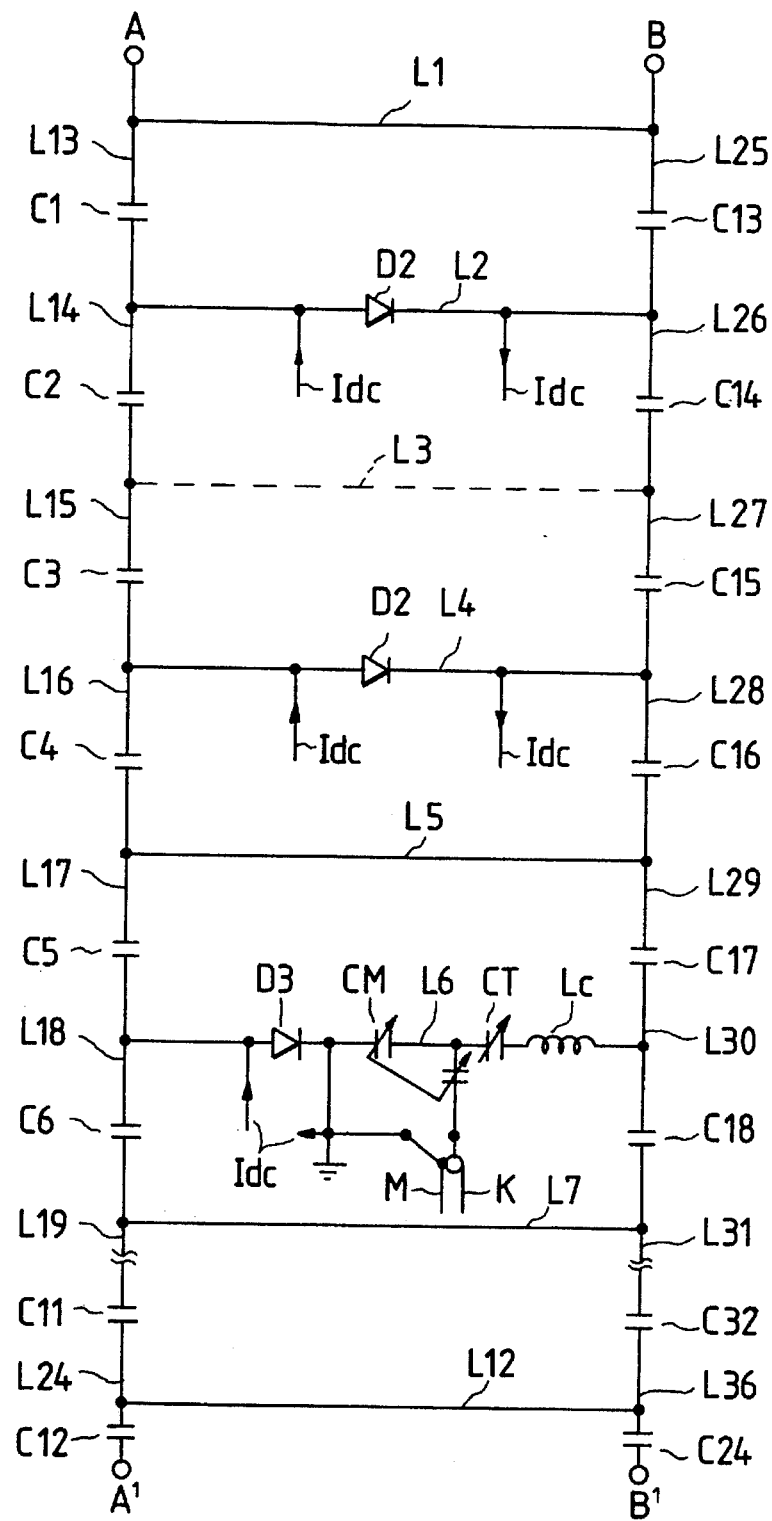
FIG. 11 is a circuit diagram showing a conventional BCR having a decoupling circuit.

Another embodiment of the present invention will be explained with reference to FIG. 12. FIG. 2 is a developed circuit diagram of the probe coil of the embodiment. In the same way as with FIG. 10, a node A1 and a node B1 are connected to each other and a node A2 and a node B2 are connected to each other so as to form a cylindrical resonator as shown in FIG. 10. The same may be said with the embodiments shown in FIGS. 13 to 19.

Figure 12:
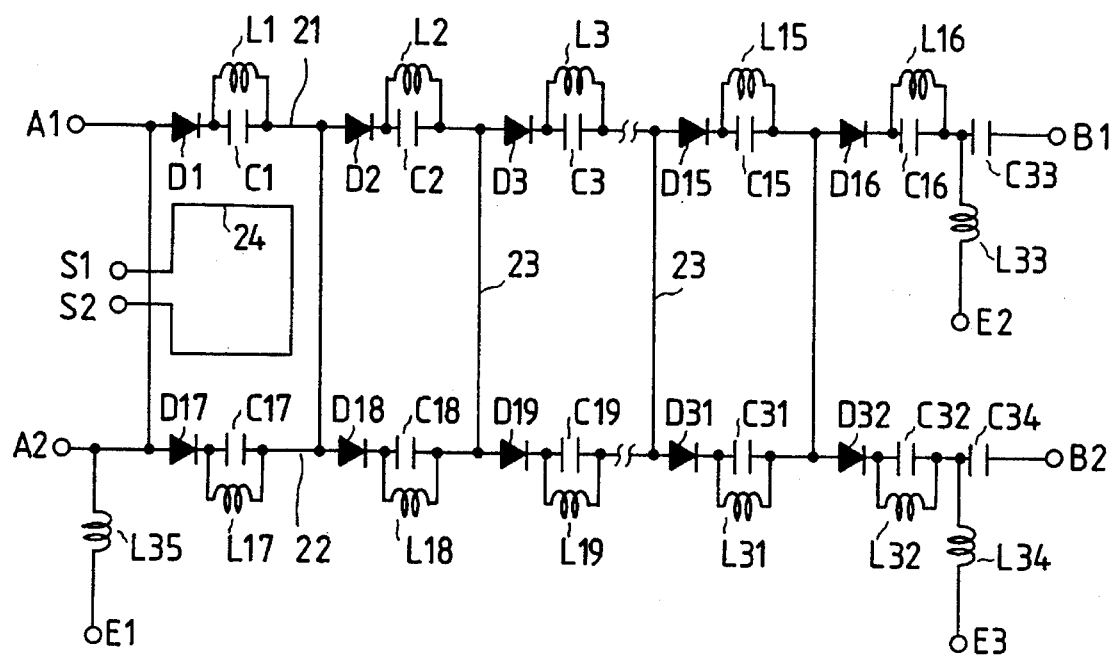
FIG. 12 is a circuit diagram showing a BCR having a decoupling circuit of another embodiment of the present invention.

In the embodiment shown in FIG. 12, a first ring element 21 formed by connecting the nodes A1 and B1 and a second ring element 22 formed by connecting the nodes A2 and B2 are connected by 16 axial conductive segments (rungs) 23 so as to form a bird cage resonator (BCR). In other words, the BCR comprises 16 current loops, each of which is formed by neighboring 2 rungs and segments of the first and second ring elements. Capacitors C1 to C16 are inserted into the segments in each peripheral direction of the ring element 21 which are delimited by the junctions of the ring element 21 and the rungs 23 respectively. Furthermore, diodes D1 to D16 are connected in series with the capacitors and inductive elements L1 to L16 are connected in parallel with the capacitors. In the same way, capacitors C17 to C32 are inserted into the segments of the ring element 22 which are delimited by the junctions of the ring element 22 and the rungs 23 respectively, and diodes D17 to D32 are connected in series with the capacitors and inductive elements L17 to L32 are connected in parallel with the capacitors. The 1st, 2nd, 3rd, 15th, and 16th current loops among the 16 current loops are shown in the drawing and the remaining current loops are omitted. All the diodes are arranged in the same direction, that is, in the direction from the 1st current loop toward the 2nd, 3rd, - - -, and 16th current loops. On the downstream side of the parallel circuit of the capacitor C16 and the inductive element L16 as viewed from the diode D16 of the 16th current loop, an inductive element L33 is connected and on the further downstream side, a capacitor 33 is inserted. Furthermore, on the downstream side of the parallel circuit of the capacitor C32 and the inductive element L32 as viewed from the diode D32, an inductive element L34 is connected and on the further downstream side, a capacitor 34 is inserted. On the other hand, on the upstream side of the diode D1 or D17 (either is acceptable) of the 1st current loop, an inductive element 35 is connected. For example, a PIN diode is a most suitable diode. The inductance of each inductive element is set to a value large enough for the resonance frequency of the BCR. The electrostatic capacities of C33 and C34 are made sufficiently larger than those of C1 to C32. By doing this, the characteristics of the BCR are not affected by the inductive elements and the capacitors C33 and C34.

When the diodes D1 to D32 are all on, the resonator operates at the initial resonance frequency. When the diodes are all off, all the current loops are turned off by the diodes. The diodes are controlled by voltage signals supplied by using terminals E1, E2, and E3 connected to the inductive elements L33, L34, and L35. E2 and E3 are grounded. When a positive potential is supplied to E1, a forward voltage is applied to the 2nd element via D1, L1, D17, and L17 of the 1st element and then to the diodes of the 3rd element and the following elements in the same way one by one so as to turn all the diodes on. Therefore, the BCR operates normally. When a negative or zero potential is supplied to E1, a reverse voltage is applied to all the diodes and all the current loops of the BCR are turned off. As a result, the probe enters the decoupling state. Describing more in detail, when the coil shown in FIG. 12 is used as a transmitting coil for a high-frequency magnetic field, a positive potential is supplied to the terminal E1 during the transmission period and a high-frequency signal is supplied to terminals S1 and S2 of a pickup coil 23. To prevent the coil in FIG. 12 from being a load on a receiving coil which is mounted beside the transmitting coil during the reception period, a negative or zero potential is supplied to the terminal E1 so as to disconnect each element of the BCR, and the receiving coil and the transmitting coil are decoupled. When the coil shown in FIG. 12 is used as a receiving coil reversely, a negative or zero potential is supplied to the terminal E1 during the transmission period so as to disconnect each current loop of the BCR, and the receiving coil and the transmitting coil are decoupled. A positive potential is supplied to the terminal E1 during the reception period and receiving signals are fetched from the terminals S1 and S2 of the pickup coil 23. Like this, the capacitors C33 and C34 are inserted so as to disconnect the ring elements 21 and 22 respectively on a DC basis and to apply a control voltage to each diode. A control signal is supplied from one location and a dedicated signal conductor is not required.

Figure 13:
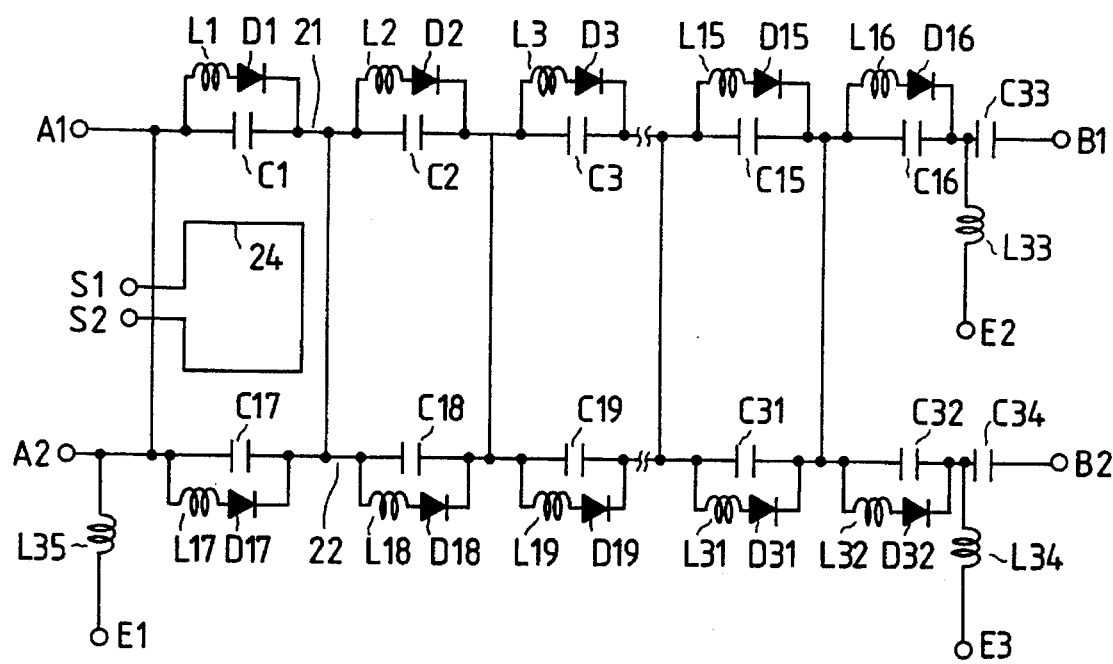
FIG. 13 is a circuit diagram of a BCR of another embodiment of the present invention.

Another embodiment will be explained with reference to FIG. 13. In the probe of this embodiment, series circuits of diodes and inductive elements (D1 and L1, D2 and L2, - - -, and D32 and L32) are connected to capacitors C1 to C32, which are inserted into the segments of ring elements 21 and 22, in parallel. Control voltage distribution capacitors C33 and C34 and inductive elements L33, L34, and L35 are connected exactly in the same way as with the embodiment shown in FIG. 4. A circuit formed by the capacitor C1, the inductive element L1, and the diode D1 and other circuits of the same type form trap circuits which resonate at the resonance frequency of the BCR when the diodes are on respectively. In this embodiment, therefore, when a diode is turned on, the corresponding trap circuit operates and the entire probe enters the decoupling state. When the diode is turned off, the trap circuit is opened and the BCR operates normally, In other words, when the terminals E2 and E3 are grounded and a positive potential control signal is supplied to the terminal E1, the probe enters the decoupling state. Furthermore, when a negative or zero positive control signal is supplied to the terminal E1, the probe operates normally. This embodiment also has characteristics that all the current loops are turned off by decoupling, and a control signal is supplied from one location, and a dedicated signal conductor is not required. When this method for externally controlling diodes is compared with the passive decoupling method for externally controlling no diodes, the S/N ratio of the probe is high because a PIN diode having an excellent diode ON-OFF characteristic can be used.

Figure 14:
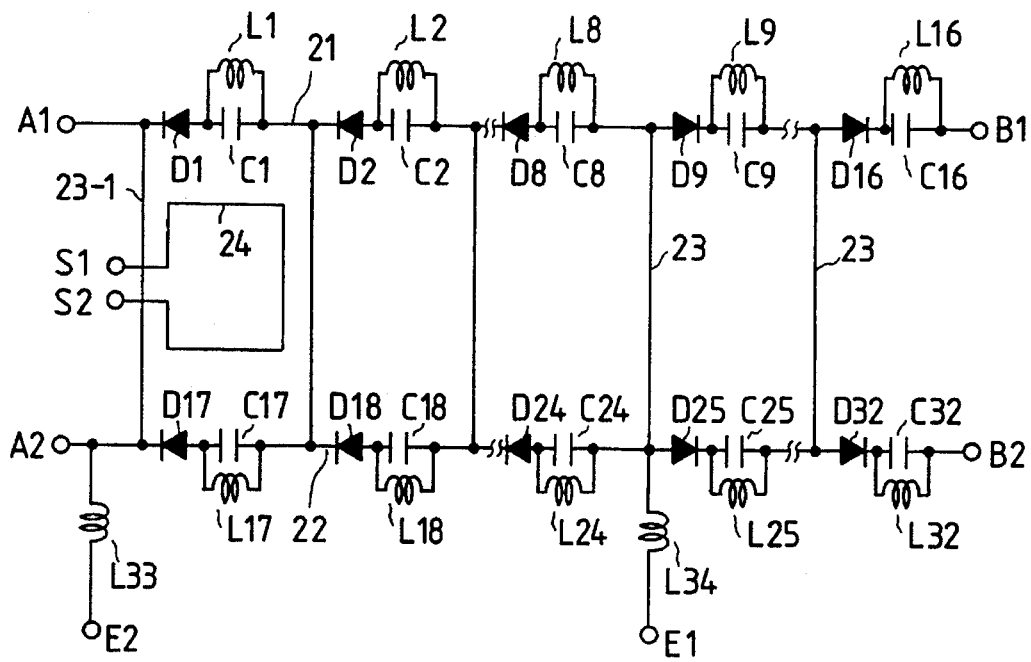
FIG. 14 is a circuit diagram of a BCR of a further embodiment of the present invention.

A further embodiment will be explained with reference to FIG. 14. A decoupling mechanism for using the BCR as a transmitting coil and/or a receiving coil is added to the probe of this embodiment in the same way as with the BCR shown in FIG. 12. The difference from FIG. 12 is that the diodes D1 to D8 and D17 to D24 are reverse in direction. Inductive elements L33 and L34 are connected to the contact of the 1st and 16th segments and the contact of the 8th and 9th segments where the diode direction reverses respectively and the other ends E1 and E2 of the inductive elements are control terminals. A DC cutting capacitor is not necessary. When the terminal E2 is grounded and a negative potential control signal is supplied to the terminal E1, each diode is turned off and the probe enters the decoupling state. When a positive potential control signal is supplied to E1, each diode is turned on and the probe operates normally. In this case, the control signal current path supplied from E1 is divided into four ways in total toward the segments on both sides of the 1st and 2nd ring elements and led to E2 finally. It is desirable to determine the positions of E1 and E2 so that the current paths divided into four ways are equal in length as shown in this embodiment. By doing this, an equal current flows through all the diodes and the diodes operate uniformly. Therefore, both the probe ON characteristic and the probe OFF characteristic are uniform spatially and the probe is a most suitable MRI probe.

Figure 15:
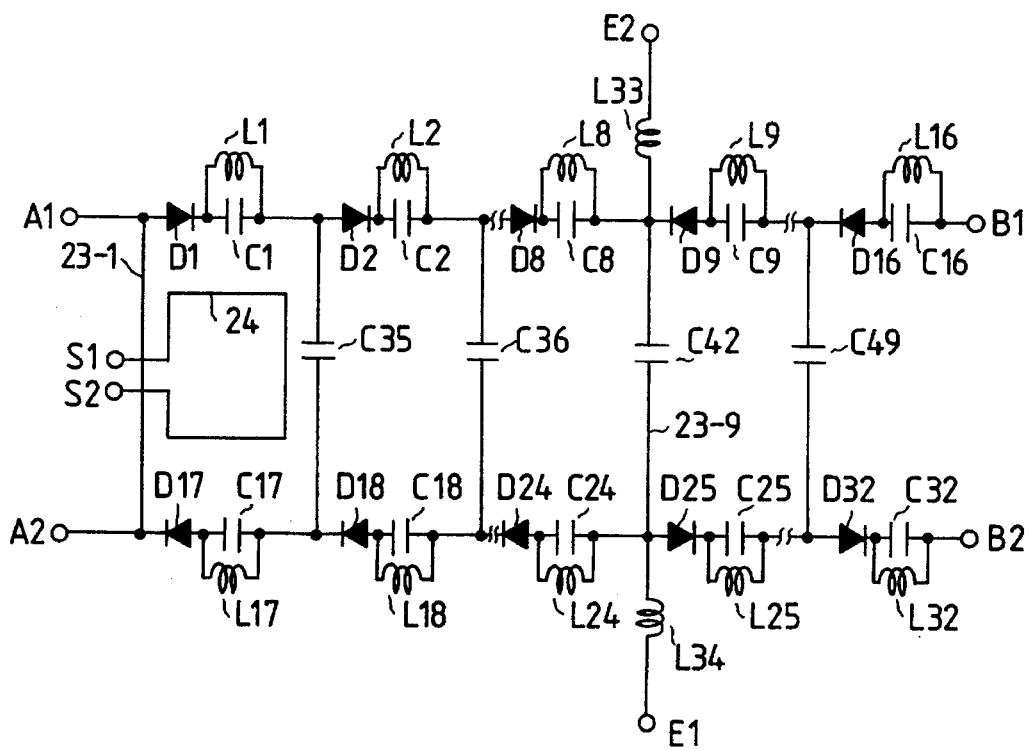
FIG. 15 is a circuit diagram of a BCR of a further embodiment of the present invention.

FIG. 15 shows a further embodiment. A decoupling mechanism for using the BCR as a transmitting coil and/or a receiving coil is added to the probe of this embodiment in the same way as with the BCR shown in FIG. 12. In this embodiment, capacitors C35 to C49 for disconnecting the circuits on a DC basis are inserted into the rungs except a rung 23-1 respectively. In a 1st ring element 21, diodes are inserted in the direction from the rung 23-1 to a rung 23-9. In a 2nd conductive loop element 22, diodes are inserted in the direction from the rung 23-9 to the rung 23-1. A diode control signal is supplied to terminals E1 and E2 which are connected to both ends of the rung 23-9 via inductive elements L33 and L34 respectively. In other words, when the terminal E2 is grounded and a positive potential signal is supplied to the terminal E1, each diode is turned on and the probe operates normally. When a negative potential signal is supplied to the terminal E1, each diode is turned off and the probe enters the decoupling state. It is desirable to increase the electrostatic capacities of the capacitors C35 to C49 inserted in the rungs large enough for the resonance frequency of the BCR so as to prevent the resonance characteristic of the BCR from being affected substantially. Furthermore, it is desirable so that rungs which are used as paths for control signals and rungs which are connected to control terminals are mounted symmetrically about the center axis of the BCR without capacitors being inserted particularly like this embodiment. If this occurs, an equal current flows through all the diodes and the diodes operate uniformly, so that the probe characteristics become uniform.

Figure 16:
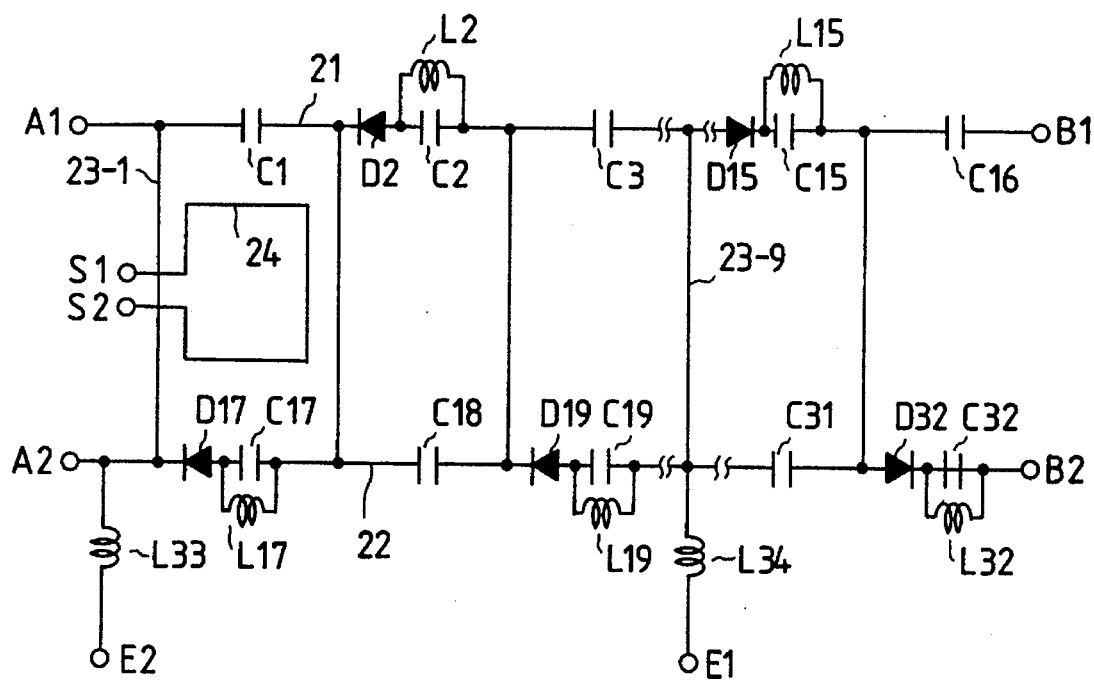
FIG. 16 is a circuit diagram of a BCR of a further embodiment of the present invention.

A further embodiment will be explained with reference to FIG. 16. A decoupling mechanism for using the BCR as a transmitting coil and/or a receiving coil is added to the probe of this embodiment in the same way as with the BCR shown in FIG. 12. The difference from FIG. 12 is that a pair of a decoupling diode and a control signal transfer inductive element is arranged in each of 16 current loops. The decoupling elements are mounted alternately on the 1st and 2nd rings such that the diode D17 and the inductive element L17 are mounted in the 2nd ring 22 of the 1st current loop and the diode D2 and the inductive element L2 are mounted in the 1st ring 21 of the 2nd current loop. The control signal terminals E1 and E2 are connected to the rungs 23-9 and 23-1 via the inductive elements L34 and L33 respectively and the diodes are arranged in the forward direction when the terminal E1 is at a positive potential. Therefore, when a negative potential control signal is supplied to the terminal E1, the probe enters the decoupling state. The characteristic of this embodiment is that since the number of diodes decreases, the degradation of the probe characteristics due to the diode ON resistance is minimized.

Figure 17:
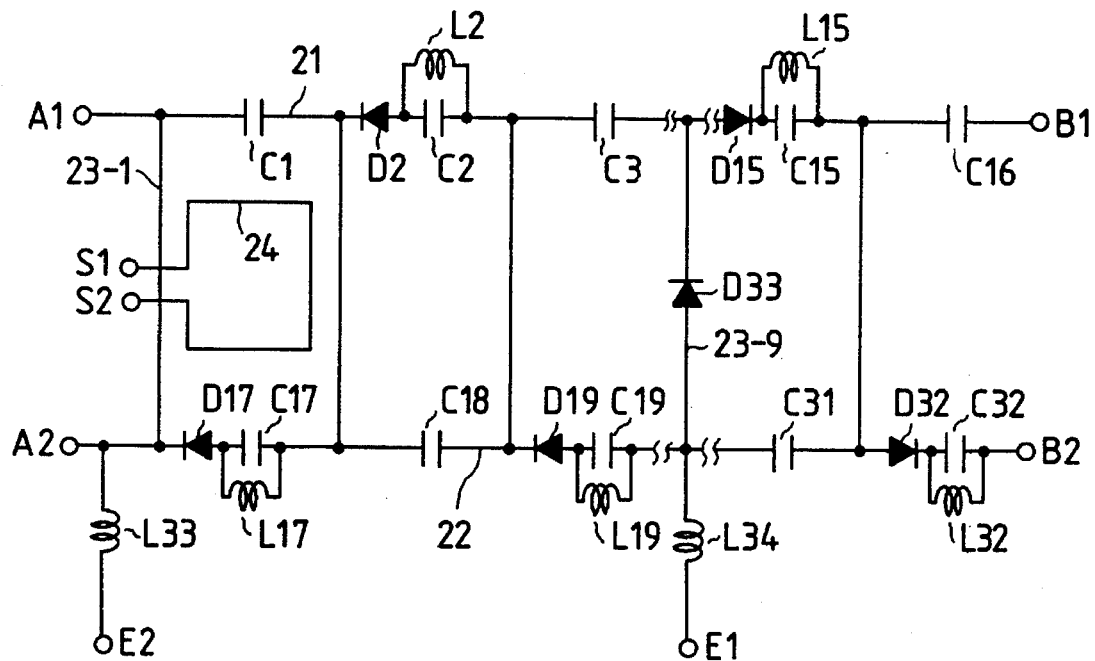
FIG. 17 is a circuit diagram of a BCR of a further embodiment of the present invention.

A further embodiment will be explained with reference to FIG. 17. In the probe of this embodiment, the diode 33 is inserted into the rung 23-9 of the probe shown in FIG. 16 and the structure of the probe is the same as that shown in FIG. 16 except the above. The diode D33 is arranged in the forward direction when the terminal E1 is at a positive potential. A composite current loop via C1, C18, C3 - - - C31, and C16 which remains when the probe shown in FIG. 16 enters the decoupling state is disconnected by D33 in this embodiment. According to this embodiment, therefore, all the conductive loops of the resonator including a composite current path can be opened or closed by a set of control signals. The diode D33 may be mounted in another rung.

Also in the above embodiment, the well-known surface coil decoupling art can be applied to decoupling of the pickup coil used for power supply or detection when necessary. In the above embodiment, the power supply method is the inductive coupling method by a pickup coil. However, it is needless to say that even when the capacitive coupling method is used, the decoupling art which satisfies the object of the present invention can be applied.

In the above embodiment, mainly a deformation example of the BCR shown in FIG. 12 is explained. The same deformation can be applied to the BCR shown in FIG. 13.

Figure 18:
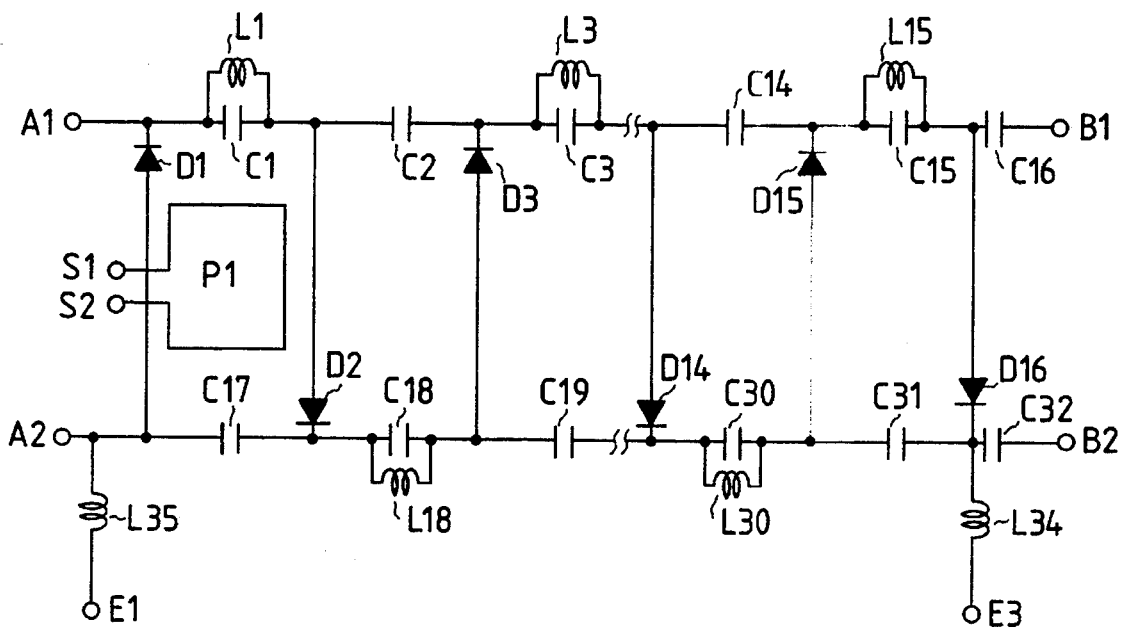
FIG. 18 is a circuit diagram of a BCR of a further embodiment of the present invention.

FIG. 18 shows another embodiment. The difference from FIG. 16 is that the diodes are inserted in the axial segments in series with the capacitors instead of the peripheral segments. This embodiment is effective in minimizing the degradation of receiving sensitivity compared with the probe shown in FIG. 16.

Figure 19:
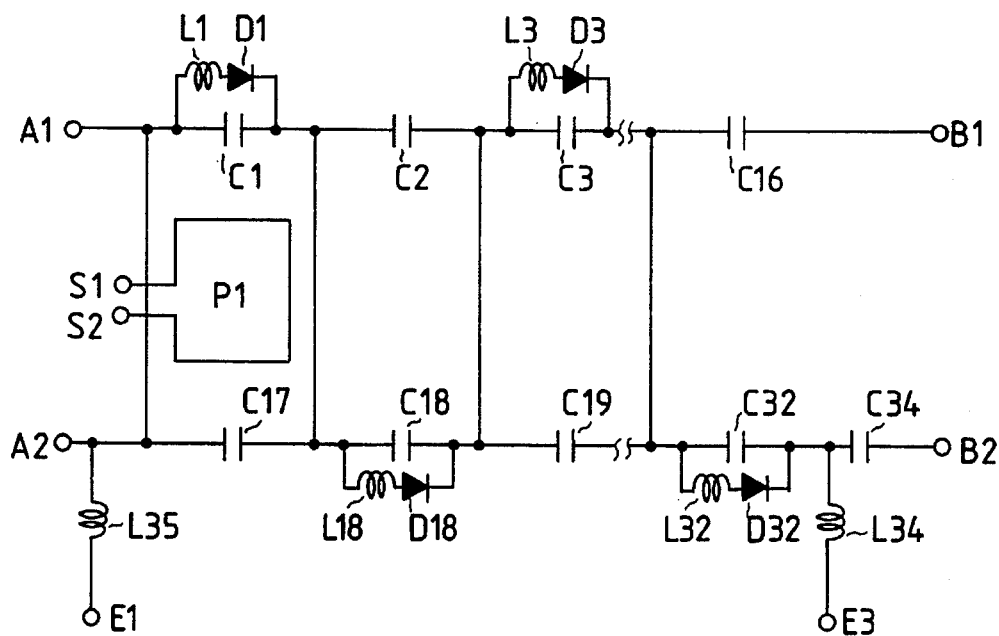
FIG. 19 is a circuit diagram of a BCR of a further embodiment of the present invention.

FIG. 19 shows another embodiment. In this embodiment, the decoupling circuit is arranged in the same way as with FIG. 16, though the trap circuits shown in FIG. 13 are used instead of the series diodes. This embodiment is effective in minimizing the degradation of receiving sensitivity compared with the probe shown in FIG. 13.

In the above embodiment, the number of elements of the BCR is 16. However, a different value such as 8 or 12 may be used.

The above embodiment is explained using an example of a high-pass BCR. However, the present invention may be applied to a low-pass BCR, a band-pass BCR, or a linear or QD slotted tube resonator according to the characteristics thereof.

Next, an example of the MRI probe system will be explained. A BCR with a large aperture (for example, 550 mm in diameter and 550 mm in length) having the structure shown in FIG. 12 is used as a transmitting probe and a BCR with a small aperture (for example, 300 mm in diameter and 300 mm in length) having the structure shown in FIG. 13 is used as a receiving probe. By this configuration, the probes can be used as head imaging RF probes by the cross method. In this system, the RF probes by the decoupling method have high decoupling performance and probe transmitting and receiving characteristics which are spatially uniform. Furthermore, when the small-aperture probe is removed and the large-aperture probe is always kept on, the large-aperture probe can transmit and receive data and can be used as a whole body probe. In this embodiment, the aforementioned other coils may be used.

According to the present invention, as mentioned above, to open or close a plurality of current loops, diodes arranged in the current loops can be controlled in a batch without complicated dedicated lines being used and a RF coil can be decoupled when necessary without the intrinsic characteristics of the RF coil being lost.

What is claimed is:

1. An MRI RF coil comprising first and second ring elements having a plurality of peripheral segments connected in a ring shape respectively which are apart from each other along a common vertical axial line, a plurality of axial conductive segments for connecting said first and second ring elements electrically to each other at the contacts of said plurality of peripheral segments, a plurality of current loops formed by neighboring axial conductive segments and two peripheral segments connected thereby, wherein at least one control signal feeding point is positioned at any one of the peripheral segments of the first or second ring elements, and capacitive elements are inserted into said plurality of peripheral segments respectively, and series circuits of diodes and inductive elements are connected in parallel with said capacitive elements, and said diodes are kept under ON and OFF control in a batch by a control voltage externally applied from the at least one control signal feeding point, and the number of the control signal feeding points is less than the number of said diodes being coupled to the peripheral segments and being kept under ON and OFF control.

2. An MRI RF coil containing a high-frequency resonator, wherein said high-frequency resonator is arranged so that a plurality of current loops which are electrically connected to each other generate a uniform high-frequency magnetic field area, and all the current loops contain switch circuits containing at least one diode, and the diodes of said plurality of current loops are kept under ON and OFF control in a batch by a control voltage applied between first and second control terminals which are connected to said high-frequency resonator via inductive elements, wherein said control voltage propagates a plurality of parallel current paths in said high-frequency resonator from said first control terminal to said second control terminal and said plurality of current paths are electrically equivalent to each other.

3. An MRI RF coil comprising first and second ring elements having a plurality of peripheral segments connected in a ring shape respectively which are apart from each other along a common vertical axial line, a plurality of axial conductive segments for connecting said first and second ring elements electrically to each other at the contacts of said plurality of peripheral segments, a plurality of current loops formed by neighboring axial conductive segments and two peripheral segments connected thereby, at least one control signal feeding point is positioned at any one of the peripheral segments of the first or second ring elements, and capacitive elements are inserted into said plurality of peripheral segments respectively, and diodes are inserted into the axial segments in series, and the direction of the diode in each segment is opposite to the direction of the diode in the neighboring segment thereof, and inductive elements are connected in parallel with one of the capacitive elements of two peripheral segments constituting each of said plurality of current loops respectively, and said diodes are kept under ON and OFF control in a batch by a control voltage externally applied from the at least one control signal feeding point.

4. A MRI RF coil according to claim 3, wherein said inductive elements are connected alternately to the peripheral segments of said first ring element and to the peripheral segments of said second ring elements along the periphery.

5. An MRI RF coil comprising first and second ring elements having a plurality of peripheral segments connected in a ring shape respectively which are apart from each other along a common vertical axial line, a plurality of axial conductive segments for connecting said first and second ring elements electrically to each other at the contacts of said plurality of peripheral segments, a plurality of current loops formed by neighboring axial conductive segments and two peripheral segments connected thereby, at least one control signal feeding point is positioned at any one of the peripheral segments of the first or second ring elements, and capacitive elements are inserted into said plurality of peripheral segments respectively, and series circuits of diodes and inductive elements are connected in parallel with one of the capacitive elements of two peripheral segments constituting each of said plurality of current loops respectively, and said diodes are kept under ON and OFF control in a batch by a control voltage externally applied from the at least one control signal feeding point, and the number of the control signal feeding points is less than the number of said diodes being coupled to the peripheral segments and being kept under ON and OFF control.

6. A MRI RF coil according to claim 5, wherein said series circuits are connected alternately to the peripheral segments of said first ring element and to the peripheral segments of said second ring elements along the periphery.

7. An MRI RF coil system of the cross coil method comprising a first RF coil and a second RF coil;

wherein said first RF coil comprises first and second ring elements having a plurality of peripheral segments connected in a ring shape respectively which are apart from each other along a common vertical axial line, a plurality of axial conductive segments for connecting said first and second ring elements electrically to each other at the contacts of said plurality of peripheral segments, a plurality of current loops formed by neighboring axial conductive segments and two peripheral segments connected thereby, at least one control signal feeding point positioned at any one of the peripheral segments of the first or second ring elements, capacitive elements inserted into said plurality of peripheral segments respectively, diodes, respective diodes being inserted into each of the axial segments in series, the direction of the diode in each segment being opposite to the direction of the diode in the neighboring segment thereof, and inductive elements, respective inductive elements being connected in parallel with one of the capacitive elements of two peripheral segments constituting each of said plurality of current loops, wherein said diodes are kept under ON and OFF control in a batch by a control voltage externally applied from the at least one control signal feeding point; and wherein said second RF coil comprises first and second ring elements having a plurality of peripheral segments connected in a ring shape respectively which are apart from each other along a common vertical axial line, a plurality of axial conductive segments for connecting said first and second ring elements electrically to each other at the contacts of said plurality of peripheral segments, a plurality of current loops formed by neighboring axial conductive segments and two peripheral segments connected thereby, at least one control signal feeding point positioned at any one of the peripheral segments of the first or second ring elements, capacitive elements inserted into said plurality of peripheral segments respectively, series circuits of a diode and an inductive element, each of said series circuits of a diode and an inductive element being connected in parallel with one of the capacitive elements of two peripheral segments constituting each of said plurality of current loops wherein said diodes are kept under ON and OFF control in a batch by a control voltage externally applied from the at least one control signal feeding point, and the number of the control signal feeding points is less than the number of said diodes being coupled to the peripheral segments and being kept under ON and OFF control.

* * * * *